United States Patent [19]  [11] 4,178,564
Ladany et al.  [45] Dec. 11, 1979

[54] HALF WAVE PROTECTION LAYERS ON INJECTION LASERS

[75] Inventors: Ivan Ladany, Stockton; Michael Ettenberg, Freehold, both of N.J.; Harry F. Lockwood, New York, N.Y.; Henry Kressel, Elizabeth, N.J.

[73] Assignee: RCA Corporation, New York, N.Y.

[21] Appl. No.: 649,324

[22] Filed: Jan. 15, 1976

[51] Int. Cl.² .............................................. H01S 3/19
[52] U.S. Cl. ................................ 331/94.5 H; 357/18; 357/52
[58] Field of Search ................... 331/94.5 H; 330/43; 357/16, 18, 52

[56] References Cited

U.S. PATENT DOCUMENTS

| 3,701,047 | 10/1972 | Caplan et al. | 331/94.5 H |
| 3,821,663 | 6/1974 | Brenn, Jr. | 331/94.5 H |
| 3,849,738 | 11/1974 | Hakki | 331/94.5 H |
| 3,914,465 | 10/1975 | Dyment et al. | 357/52 X |
| 3,943,462 | 3/1976 | Thompson | 331/94.5 H |

OTHER PUBLICATIONS

Ladany et al., "Infulence of Device Fabrication Parameters on Gradual Degradation of (AlGa)As CW Laser Diodes", Applied Physics Letters vol. 25, No. 12, Dec. 15, 1974, pp. 708-710.
Kressel et al., "Reliability Aspects and Facet Damage in High-Power Emission from (AlGa)As CW Laser Diodes at Room Temperature", RCA Review, vol. 36, Jun. 1975, pp. 230-239.
Ettenberg et al., Applied Physics Letters, vol. 18, No. 12, Jun. 15, 1971, pp. 571-573.
Alferov et al., Soviet Physics Semicond., vol. 8, No. 10, Apr. 1975, pp. 1321-1322.

Primary Examiner—James W. Davie
Attorney, Agent, or Firm—H. Christoffersen; D. S. Cohen

[57] ABSTRACT

A body of semiconductor material of an injection laser device, capable of operating at a power level up to a few milliwatts per micrometer of emitting width, has two opposed facet surfaces. On at least one of the facet surfaces is a protection layer of an insulating material having an optical thickness equal to approximately one-half the vacuum wavelength of the optical radiation emitted by the device.

9 Claims, 3 Drawing Figures

HALF WAVE PROTECTION LAYERS ON INJECTION LASERS

BACKGROUND OF THE INVENTION

The Government has rights in this invention pursuant to Contract No. N000-14-73-C-0335 awarded by the Department of the Navy.

The present invention relates to protection layers on the facet surfaces of semiconductor injection lasers and more specifically to protection layers of an optical thickness equal to approximately one-half the vacuum wavelength of the emitted optical radiation.

Protection layers have been placed on the facet surfaces of high power injection lasers to reduce the damage occuring to those surfaces which is termed catastrophic facet damage. High power lasers typically operate at power levels of 50 milliwatts per micrometer of emitting radiation width. Usually high power lasers are incapable of operating continuously or at high duty cycles, i.e. 10% or more duty cycle. Catastrophic facet damage usually occurs when the laser is first pulsed. It is believed that catastrophic facet damage is caused by an optoacoustic effect in which the optical flux emitted from the laser generates stress waves. Typically, the optical thickness of the protection layer of such lasers is equal to one-quarter of the vacuum wavelength of the optical radiation emitted from the laser, i.e. one-quarter wave in thickness. Optical thickness of a layer is defined as the index of refraction of the layer multiplied by the actual physical thickness of the layer. In the article entitled "Control of Facet Damage in GaAs Laser Diodes", by M. Ettenberg et al, Applied Physics Letters, Vol. 18, No. 12, June 15, 1971, it is stated that in the instance of catastrophic facet damage occuring with the commencement of operating the laser, a one-quarter wave protection layer is a better deterrent to catastrophic facet damage than a one-half wave protection layer, i.e. a layer having an optical thickness equal to one-half the vacuum wavelength of the emitted radiation. In point of fact, the article stated that the probability of catastrophic facet damage with a one-half wave protection layer was equal to that of an uncoated facet surface.

We have now discovered that a different, although related facet damage, occurs on facet surfaces, principally lasers operating at low power levels, up to a few milliwatts per micrometer of emitting radiation width. This damage is termed facet erosion. Typically, lower power level lasers may operate at duty cycles of 10% or more. Facet erosion, unlike catastrophic facet damage, is not noticeable at the commencement of laser operation, but occurs over an extended period of laser operation, typically after several thousand hours of operation. The one-quarter wave protection layer may assist in deterring facet erosion, but one disadvantage of a protection layer of one-quarter wave thickness is that it lowers the reflectivity at the facet surface, and consequently results in a laser with a high threshold current density. Therefore, it would be most advantageous in the field of injection lasers generally operating at low power levels to have a protection layer that will provide both reduced facet erosion over an extended period of time and a low threshold current density.

SUMMARY OF THE INVENTION

A semiconductor injection laser which is capable of operating at power levels up to a few milliwatts per micrometer of emitting radiation width includes a rectangular parallelepiped body of a single crystaline semiconductor material. The body has opposed facet surfaces, opposed side surfaces extending to the facet surfaces and opposed contact surfaces extending to the facet surfaces and the side surfaces. A recombination region capable of generating electroluminescence is in the body. The recombination region extends from one facet surface to the opposite facet surface. A protection layer is on at least one facet surface. The protection layer is of an optical thickness equal to approximately "n" times one-half the vacuum wavelength of the emitted radiation, where "n" is an integer equal to or greater than 1.

DETAILED DESCRIPTION OF THE INVENTION

Figure 1:
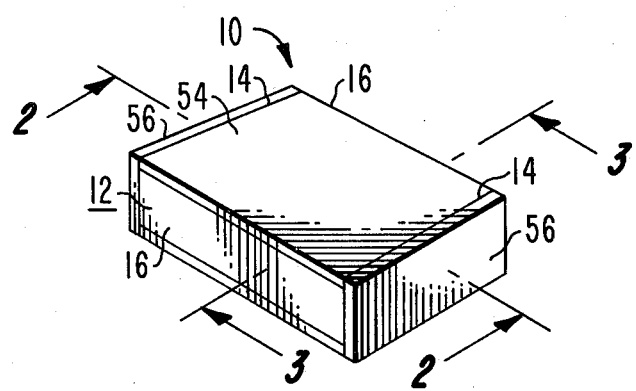
FIG. 1 is a perspective view of a semiconductor injection laser with protection layers of the present invention.
Figure 2:
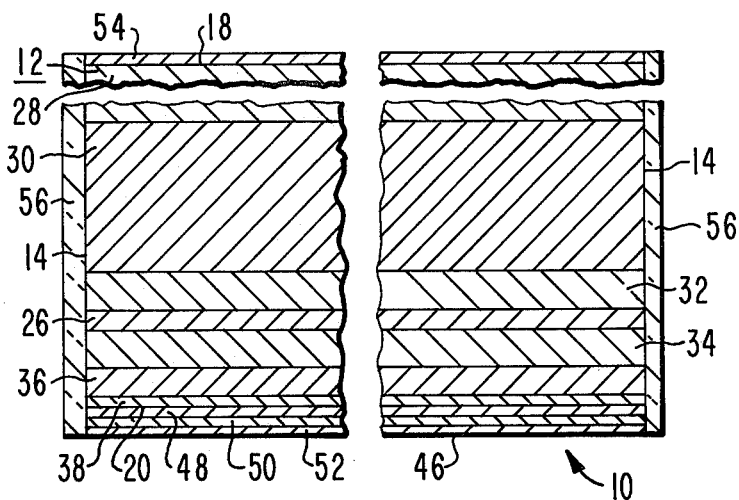
FIG. 2 is a longitudinal sectional view of the laser and protection layers taken along line 2—2 of FIG. 1.
Figure 3:
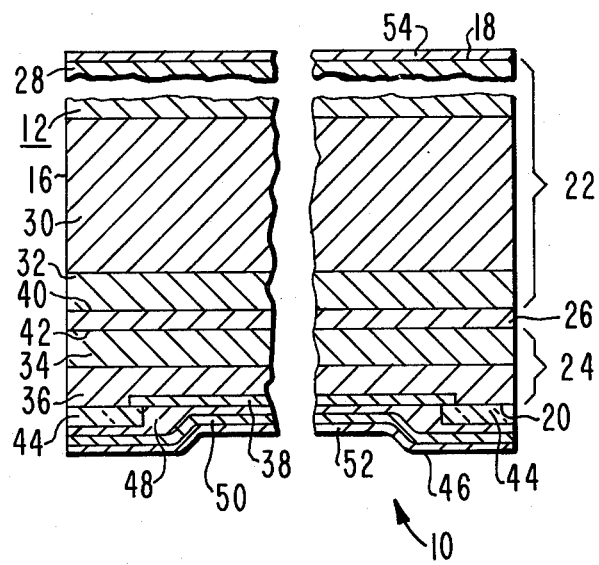
FIG. 3 is a transverse sectional view of the laser taken along line 3—3 of FIG. 1.

Referring to FIGS. 1,2 and 3, a semiconductor injection laser capable of operating at power levels up to a few milliwatts per micrometer of emitting radiation width and having the protection layer of the present invention is generally designated as 10. For the purpose of describing the protection layer of the present invention, the injection laser 10 is a continuous wave (C.W.) injection laser capable of 100% duty cycle operation. Preferably, the protection layer of the present invention is utilized on C.W. injection lasers.

The injection laser 10 comprises a rectangular parallelepiped body 12 of a single crystalline semiconductor material. The body 12 has opposed facet surfaces 14, opposed side surfaces 16 extending to the facet surfaces 14, and first and second opposed contact surfaces 18 and 20 which extend to the facet surfaces 14 and side surfaces 16.

The semiconductor body 12 has therein a first region 22 of N type conductivity extending along the first contact surface 18, a second region 24 of P type conductivity extending along the second contact surface 20, and a third region 26 contiguous to and between the first and second regions 22 and 24. The third region 26 may be either P type or N type with a carrier concentration of preferably $10^{16}$ to $10^{17}$ carriers per cubic centimeter. The first region 22, second region 24 and third region 26 extend between the facet surfaces 14 of the semiconductor body 12.

The first region 22 is made up of a substrate 28 of highly doped (high conductivity) gallium arsenide, a first epitaxial layer 30 of N type gallium arsenide on the substrate 28 and a second epitaxial layer 32 of N type aluminum-gallium arsenide on the first epitaxial layer 30. The third region 26 is a thin third epitaxial layer of aluminum-gallium arsenide on the second epitaxial layer 32. The second region 24 is made up of a fourth epitaxial layer 34 of P type aluminum-gallium arsenide on the third epitaxial layer forming the third region 26, a fifth epitaxial layer 36 of P type gallium arsenide on the fourth epitaxial layer 34, and a thin highly doped (high conductivity) P type diffused layer 38 in the fifth epitaxial layer 36 and extending along the second contact surface 20 of the semiconductor body 12.

The third region 26 forms the recombination region of the injection laser 10 and is generally thin, i.e. less than 0.4 micrometers. The second epitaxial layer 32 of the first region 22 is of a thickness of between 1 and 3.5 micrometers and has an aluminum content greater than the aluminum content of the third region 26. The fourth epitaxial layer 34 of the second region 24 is of a thickness of between 0.3 and 1 micrometer and also has an aluminum content greater than the aluminum content of the third region 26. The difference in the aluminum content between the materials of the second and fourth epitaxial layers 32 and 34 and the third region 26 forms heterojunctions 40 and 42 between the third region 26 and the second and fourth epitaxial layers 32 and 34, respectively.

On the second contact surface 20 of the semiconductor body 12 are a pair of spaced apart thin strips 44 of an electrical insulating material, such as silicon dioxide. The insulating strips 44 extend along opposite sides of the second contact surface 20 from one facet surface 14 to the other facet surface. Each strip should extend from its adjacent side surface 16 a distance of at least 5 micrometers. A metal contact 46 is on the second contact surface 20 of the semiconductor body 12 between the insulating strips 44, and on the insulating strips. The metal contact 46 typically includes three superimposed layers 48, 50 and 52 of electrically conductive metals which can be applied by standard methods. The metal of the first layer 48, which is on the surface 20 of the semiconductor body 12, must also be capable of good adherence to and provide a good ohmic contact with the semiconductor body 12. Titanium or chromium are suitable metals for the first layer 48. The metal of the third layer 52 which is the outermost layer, should also be relatively non-oxidizable and easily bonded to. Gold is a suitable metal for the third layer 52. The second layer 50, the intermediate layer, should also be capable of providing good adherence of the third layer 52 to the first layer 48 and be capable of preventing undesirable alloying of the metals of the first and third layers. Platinum or nickel are suitable metals for the second layer 50.

A metal contact 54 is on the first contact surface 18 of the semiconductor body 12. The metal contact 54 can be of any electrically conductive metal which adheres well to and makes a good ohmic contact with the semiconductor body 12. The contact 54 can be a multi-layer contact, such as the contact 46 on the second contact surface 20 or can be of a single metal, such as tin.

On each of the facet surfaces 14 is a protection layer 56. At least one of the protection layers 56 is partially transparent to the optical radiation emitted from the laser 10. The protection layer 56 is of an electrically insulating material which is preferably impervious to moisture in the ambient, and will resist attack of chemicals to which it may come in contact, for example residue chemicals such as soldering flux as a result of mounting the laser 10. Aluminum oxide ($Al_2O_3$), silicon dioxide ($SiO_2$) or silicon nitride ($Si_3N_4$) are suitable materials for such a protection layer. In addition, the protection layer 56 is preferably of an optical thickness, approximately equal to one-half the vacuum wavelength of the emitted optical radiation.

In the operation of the semiconductor injector laser 10 a forward bias voltage is applied to the body 12 by connecting the contacts 46 and 54 to a source of current. As a result of the forward bias voltage, charged carriers are injected into the third region 26 from the first and second regions 22 and 24. The oppositely charged carriers injected into the third region 26 recombine in the third region 26 to generate electromagnetic radiation. Radiation that originates near one of the facet surfaces 14 will travel along the axis of the third region 26 toward the opposite facet surface 14. While traveling along the third region 26 the radiation will grow in intensity as a result of stimulated emission until it reaches the opposite facet surface 14. At the opposite facet surface 14 the radiation may be reflected back into the third region 26 so that the amplification of the radiation can continue. As is well known in the art, one factor determing the reflectivity at the facet surfaces 14 is the thickness of protection layers 56. The radiation amplitude will build up by the repeated passage through the third region 26. With at least one of the facet surfaces 14 being semi-transparent a portion of the radiation can escape through it, constituting the optical radiation output of laser 10.

From the cited M. Ettenberg et al article it would seem obvious to one skilled in the semiconductor art to conclude that facet damage would not be reduced with a one-half wave protection layer on a laser operating at low power levels. However, it has been discovered that a one-half wave protection layer on the facet surface has provided injection lasers operating at low power levels over an extended period of time, i.e. a few thousand hours or more of operation, with a reduction in facet erosion comparable to the reduction in catastrophic damage provided by the one-quarter wave protection layer.

The reason for the reduction in facet erosion by the one-half wave protection layer is not known for certain, but it is believed to be caused by a reduction in the laser's photo induced chemical reactions at the facet surface 14.

The one-half wave optical thickness of the protection layer 56 does not alter the optical properties of the facet surfaces 14. As is well known in the field of optics, the reflectivity at a surface is a function of the index of refraction of the media on both sides of the surface. In the injection laser 10, as described, the reflectivity at the facet surfaces 14, if exposed to air, is approximately 32%, and with the one-half wave layer 56 on the facet surfaces 14 the reflectivity at the surfaces 14 is still about 32%. On the contrary, if the protection layer is of a one-quarter optical thickness, the reflectivity at the facet surfaces is reduced to a value as low as 0% depending upon the index of refraction of the protection layer. The higher the reflectivity at the facet surfaces 14 the less loss there is of the optical radiation needed to maintain the injection laser at a lasing state, thus one-half wave protection layer 56 reduces the threshold current density of the laser 10 as compared to a one-quarter wave protection layer.

In the fabrication of the injection laser 10, the body 12 is formed by sequentially growing the regions of the body 12 by techniques well known in the art, such as liquid or vapor phase epitaxy. The metal contacts 54 and 46 are fabricated by evaporation and masking techniques well known in the art. Two opposed surfaces of the body 12 are then cleared to form the facet surfaces 14. The body 12 with the contacts 54 and 46 is then placed in a fixture such that when the insulating material of the protection layer is deposited on a facet surface none of the insulating material will be deposited on the contacts 54 and 46. Then the fixture is placed in an evaporation chamber of the type well known to those skilled in the art. The evaporation chamber is evacuated to a pressure of about $5 \times 10^{-6}$ torr and the body 12 is heated to a temperature of approximately 125° C., at which time the insulating material is deposited onto the facet surface. The laser 10 is completed by repeating this technique to form the protection layer 56 on the opposite facet surface.

The one-half wave protection layer 56 has been described as being on both of the facet surfaces 14, but it is anticipated by the present invention that the one-half wave protection layer 56 need be on only one of the facet surfaces 14, and on the opposite facet surface is a reflection coating which provides more reflectivity at the facet surfaces 14 then is optically inherent at the facet surfaces 14. These reflection coatings are well known to those in the art. Typically, a reflection coating is a layer of a dielectric material directly on the facet surface with a metal layer, such as gold, aluminum or chromium, on the dielectric layer, or it may instead include a plurality of layers of dielectric materials. In addition, the protection layer instead of being a single layer of an insulating material may be a plurality of layers of dielectric material. Fabrication of one-half wave protection layers in the form of a plurality of dielectric layers is well known to those in the semiconductor art. Dielectric materials suitable for a reflection coating or the protection layer are aluminum oxide, magnesium fluoride and silicon dioxide.

Furthermore, while the optical thickness of the protection layer 56 has been described as being of a one-half wave, it is anticipated that the optical thickness of the protection layer may approximately equal "n" one-half the vacuum wavelength of the emitted optical radiation, where "n" is an integer equal to or greater than 1. A protection layer of an optical thickness equal to "n" times one-half the vacuum wavelength of the radiation will function the same and provide the same advantages as the one-half wave protection layer 56 as described.

The one-half wave protection layer of the present invention provides an injection laser capable of operating at lower power levels with a low threshold current density and reduced facet erosion.

We claim:

1. A semiconductor injection laser comprising:
a rectangular parallelepiped body of a single crystalline semiconductor material having opposed facet surfaces, opposed side surfaces extending to said facet surfaces, opposed contact surfaces extending to said facet surfaces and said side surfaces, with a recombination region capable of generating electroluminescence in said body and capable of operating at power levels up to a few milliwatts per micrometer of emitting radiation width, said recombination region extending from one facet surface to the opposite facet surface; and
a protection layer on at least one facet surface capable of reducing facet erosion of said facet surface, said protection layer being of an optical thickness, equal to approximately "n" times one-half the vacuum wavelength of the emitted radiation, where "n" is an integer equal to or greater than 1.

2. The semiconductor injection laser in accordance with claim 1 wherein said protection layer is an insulating material.

3. The semiconductor injection laser in accordance with claim 2 wherein said insulating material is impervious to moisture in the ambient and will resist attack of chemicals.

4. The semiconductor injection laser in accordance with claim 3 wherein said insulating material is aluminum oxide, $Al_2O_3$.

5. The semiconductor injection laser in accordance with claim 3 wherein said insulating material is silicon dioxide, $SiO_2$.

6. The semiconductor injection laser in accordance with claim 3 wherein said insulating material is silicon nitride, $Si_3N_4$.

7. The semiconductor injection laser in accordance with claim 1 wherein said protection layer is on both opposed facet surfaces.

8. The semiconductor injection laser in accordance with claim 1 wherein said protection layer has an optical thickness equal to approximately one-half the vacuum wavelength of the emitted radiation.

9. The semiconductor injection laser in accordance with claim 1 wherein said protection layer comprises a plurality of layers of dielectric material.

* * * * *